(12) United States Patent
Morsheim et al.

(10) Patent No.: US 8,669,580 B2
(45) Date of Patent: Mar. 11, 2014

(54) SCALABLE HEAT DISSIPATING MICROELECTRONIC INTEGRATION PLATFORM (SHDMIP) FOR LIGHTING SOLUTIONS AND METHOD OF MANUFACTURING THEREOF

(75) Inventors: Thomas Joachim Werner Morsheim, Manila (PH); Fernando Villon Capinig, Manila (PH); Dandy Navarro Jaducana, Manila (PH); Anthony Augusto Malon Galay, Manila (PH)

(73) Assignee: PSI Technologies, Inc., Metro Manila (PH)

( * ) Notice: Subject to any disclaimer, the term of this patent is extended or adjusted under 35 U.S.C. 154(b) by 52 days.

(21) Appl. No.: 13/288,979

(22) Filed: Nov. 4, 2011

(65) Prior Publication Data
US 2012/0161632 A1 Jun. 28, 2012

Related U.S. Application Data (60) Provisional application No. 61/426,497, filed on Dec. 22, 2010, provisional application No. 61/452,632, filed on Mar. 14, 2011.

(51) Int. Cl.
*H01J 7/44* (2006.01)
*H01J 7/24* (2006.01)
(52) U.S. Cl.
USPC .................. 257/99; 257/E33.059; 257/98
(58) Field of Classification Search
USPC .......... 257/88, 98–100, 84, 77, E33.059, E21
See application file for complete search history.

(56) References Cited

U.S. PATENT DOCUMENTS

| | | | |
|---|---|---|---|
| 5,647,034 A | 7/1997 | Matsuda et al. | |
| 6,373,078 B1 | 4/2002 | Yea | |
| 2006/0054915 A1 | 3/2006 | Chang | |
| 2006/0133044 A1 | 6/2006 | Kim et al. | |
| 2007/0210325 A1* | 9/2007 | Park et al. | 257/98 |
| 2008/0023721 A1* | 1/2008 | Lee et al. | 257/99 |
| 2008/0273340 A1 | 11/2008 | Ng et al. | |
| 2009/0001393 A1 | 1/2009 | Seo et al. | |

FOREIGN PATENT DOCUMENTS

| | | |
|---|---|---|
| EP | 1816688 A2 | 8/2007 |
| JP | 5136452 A | 6/1993 |

OTHER PUBLICATIONS

Extended European Search Report of European patent application No. 11195013.5 completed on Mar. 7, 2013 (5 pages).

* cited by examiner

*Primary Examiner* — Anh Mai
*Assistant Examiner* — Elmito Breval
(74) *Attorney, Agent, or Firm* — Pyprus Pte Ltd (57) ABSTRACT

The present invention provides a Scalable Heat Dissipating Microelectronic Integration Platform (SHDMIP) LED Package having excellent heat dissipation and protection to LED, thus extending the lifespan of the LED. The SHDMIP LED package comprises a dual lead frame assembly comprising bottom and top lead frame, protection and driver circuits conductively attached to the bottom lead frame and a LED conductively attached to the top lead frame. The bottom lead frame comprises heat sink pad for heat dissipation purpose. Plurality of SHDMIP LED packages of the present invention can be configured in a matrix or row, forming a SHDMIP LED array for various lighting solutions. A method to manufacture the SHDMIP LED array of the present invention is provided herein.

29 Claims, 10 Drawing Sheets

SCALABLE HEAT DISSIPATING MICROELECTRONIC INTEGRATION PLATFORM (SHDMIP) FOR LIGHTING SOLUTIONS AND METHOD OF MANUFACTURING THEREOF

This application claims the benefit of U.S. Provisional Application No. 61/426,497, filed on Dec. 12, 2010 and U.S. Provisional Application No. 61/452,632 filed on Mar. 14, 2011.

FIELD OF THE INVENTION

The present invention relates to integrated microelectronic device. In particular, the present invention provides a Scalable Heat Dissipating Microelectronic Integration Platform (SHDMIP), particularly for lighting applications, with a good heat dissipation capability, thus long lifespan, and a method of manufacturing thereof.

BACKGROUND

Application of integrated microelectronic devices for lighting applications includes solid-state lighting (SSL) applications, light emitting diodes (LEDs), organic light emitting diodes (OLED), optical devices, and the like. Currently, the available manufacturing methods of the integrated microelectronic devices for lighting applications are costly and non-standardized. As illustration, to manufacture LED lighting solutions, LED dies manufacturers and/or integrators manufacture and configure plurality of single LED die into LED arrays. Simultaneously, semiconductor manufacturers will manufacture power conversion for the LED arrays, and also manufacture LED protection devices in separate semiconductor packages. All of LED components are then delivered to LED luminaire manufacturers, who will use all components to assemble LED lighting solutions. Consequently, because of such complicated manufacturing process, the LED lighting solutions suffer from high manufacturing costs and are highly unreliable. Early failures of LED lighting applications are indeed unavoidable, regardless of the fact that the LED dies have long life span.

Besides high-manufacturing cost and poor manufacturing process, another important issue dealt with the integrated microelectronic devices for lighting applications is pertained to heat generated from the device and dissipation system thereof. Insufficient heat dissipation affects performance and reduces life span of the integrated microelectronic devices for lighting applications. The insufficient heat dissipation leads to dimness, even early failure of most integrated microelectronic devices for lighting applications.

US 2006/0054915 discloses a LED package which includes a heat conductive base plate and a light emitting diode (LED) mounted thereon. The heat conductive base plate functions for heat dissipation. The LED package further comprises contact electrodes disposed on a lower opaque layer which surrounds the heat conductive base plate.

SUMMARY

One aspect of the present invention provides a Scalable Heat Dissipating Microelectronic Integration Platform (SHDMIP) package comprising a dual lead frame assembly, which has a bottom lead frame having a first heat sink pad for heat dissipation system of the SHDMIP package and a top lead frame having a second heat sink pad, wherein the top lead frame is electrically attached onto the bottom lead frame. The SHDMIP package further comprises protection and driver circuits electrically connected to the bottom lead frame of the dual lead frame assembly and a microelectronic lighting device thermally and electrically connected the top lead frame of the lead frame assembly, whereby the lead frame assembly electrically connects the microelectronic lighting device to the protection and driver circuit. The microelectronic lighting device is selected from the group consisting of light emitting diodes (LEDs), organic light emitting diodes, infrared light emitting diodes, Solid State Lighting (SSL) or any optical devices.

In another embodiment of the present invention, there is provided a SHDMIP package, wherein the protection and driver circuit is electrically attached to the top lead frame of the dual lead frame assembly.

Another aspect of the present invention provides A Scalable Heat Dissipating Microelectronic Integration Platform (SHDMIP) package for lighting solutions comprising a dual lead frame assembly which has a bottom lead frame having a heat sink pad for heat dissipation of the SHDMIP package and a top lead frame thermally attached onto the bottom lead frame. The top lead frame comprises a cathode and an anode for external connection purposes. The SHDMIP package further comprises protection and driver circuit electrically and thermally connected to the top lead frame of the lead frame assembly, LED die electrically and thermally attached to the top lead frame and electrically connected to the protection and driver circuit, whereby the dual lead frame assembly thermally connects the LED die to the heat sink of the bottom lead frame and a clear lens molded on the top lead frame, wherein the clear lens cover the LED die for creating optical path for the LED die.

A further aspect of the present invention provides a Scalable Heat Dissipating Microelectronic integration Platform (SHDMIP) array comprising a matrix of dual lead frame assembly. The matrix of dual lead frame assembly comprises a matrix of a plurality of bottom lead frames, wherein each of bottom lead frames has a first heat sink pad and is interconnected by a plurality of bottom tie bars and a matrix of a plurality of top lead frames, wherein each of top lead frames has a second heat sink pad and is interconnected by a plurality of top tie bars. The matrix of plurality of top lead frames further comprises an anode and a cathode for external connection purpose, and is thermally and electrically attached to the matrix of plurality of bottom lead frames. The SHDMIP array further comprises a plurality of protection and driver circuits, wherein each of the plurality of protection and driver circuits is electrically attached onto each of the plurality of top lead frames of the matrix of dual lead frame assembly and a plurality of microelectronic lighting devices electrically attached to the matrix of the plurality of top lead frames and to each of the plurality of protection and driver circuits.

In another embodiment of the present invention, the plurality of protection and driver circuits is respectively attached to each of the bottom lead frames of the matrix of dual lead frame assembly.

One aspect of the present invention provides a method to manufacture Scalable Heat Dissipating Microelectronic Integration Platform (SHDMIP) array. The method comprises the steps of providing a matrix of a plurality of bottom lead frames having a plurality of heat sink, the plurality of bottom lead frames are interconnected by a plurality of bottom tie bars; thermally and electrically attaching a plurality of protection circuitry devices onto the matrix of the plurality of bottom lead frames; thermally and electrically attaching a matrix of a plurality of top lead frames interconnected by a plurality of top tie bars onto the matrix of the plurality of bottom lead frames to form a matrix of a plurality of dual lead frame assembly, wherein each of the plurality of top lead frames comprises an anode and a cathode for external connection purpose; and thermally and electrically connecting a plurality of microelectronic lighting devices to the matrix of the plurality of top lead frames.

In a further embodiment, the protection and driver circuits are attached to the top lead frames of the dual lead frames assembly.

Another aspect of the present invention provides a method to manufacture a Scalable Heat Dissipating Microelectronic Integration Platform (SHDMIP) array for lighting solutions. The method comprises the steps of providing a matrix of a plurality of bottom lead frames having a plurality of heat sinks, each of the plurality of bottom lead frames is interconnected by a plurality of bottom tie bars, providing a matrix of a plurality of top lead frames having an anode and a cathode for external connection purpose, wherein each of the plurality of top lead frames is interconnected by a plurality of top tie bars, thermally attaching the matrix of a plurality of top lead frames, to the matrix of the plurality of bottom lead frames, forming a matrix of a plurality of dual lead frame assembly, electrically attaching a plurality of protection and driver circuits to the cathode of the top lead frames of the matrix of the plurality of dual lead frame assembly, electrically attaching a plurality of LED dies to the cathode of the top lead frames of the matrix of the plurality of dual lead frame assembly, wirebonding each of the plurality of LED dies and the plurality of protection and driver circuits to the anode of the matrix of the plurality of top lead frames and encapsulating the LED die and the plurality of protection and driver circuits with a clear lens for protection and creating optical path for the plurality of LED dies.

BRIEF DESCRIPTION OF THE DRAWINGS

This invention will be described by way of non-limiting embodiments of the present invention, with reference to the accompanying drawings, in which.

DETAILED DESCRIPTION

The following descriptions of a number of specific and alternative embodiments are provided to understand the inventive features of the present invention. It shall be apparent to one skilled in the art, however that this invention may be practiced without such specific details. Some of the details may not be described in length so as to not obscure the invention. For ease of reference, common reference numerals will be used throughout the figures when referring to same or similar features common to the figures.

The present invention provides a scalable heat dissipating microelectronic integration platform for lighting applications. The scalable heat dissipating microelectronic integration platform comprises a dual lead frame assembly. The dual lead frame assembly comprises a bottom lead frame and a top lead frame. The dual lead frame assembly can accommodate many electronic components essential for assembly of reliable and robust microelectronic device for lighting applications.

The present invention will now be further illustrated by referring to the following examples of assembly of scalable heat dissipating microelectronic integration platform, with LED as the lighting elements. The assembly will be referred as SHDMIP LED package. It is to be understood that the following examples do not limit the present invention in any way.

Figure 1:
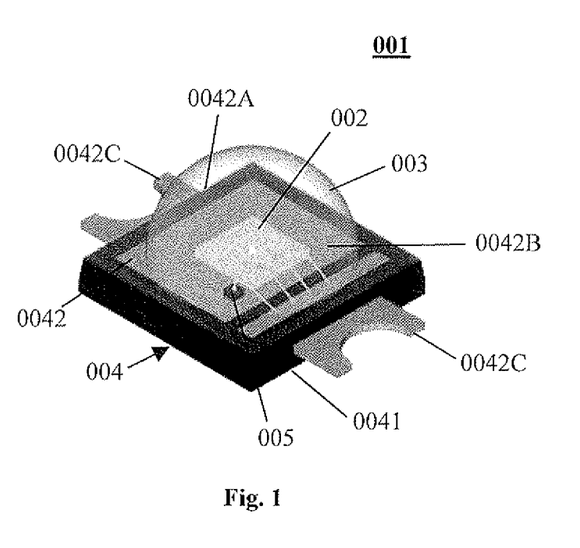
FIG. 1 shows a perspective view of a single SHDMIP LED package according to one embodiment of the present invention.

FIG. 1 illustrates a perspective view of a single SHDMIP LED package 001 according to one embodiment of the present invention. The SHDMIP LED package 001 of this embodiment comprises an LED die 002 encapsulated with a clear lens 003 and a dual lead frame assembly 004. The dual lead frame assembly 004 of this embodiment comprises a bottom lead frame 0041 having a heat sink for heat dissipation and a top lead frame 0042 comprising a cathode 0042A and an anode 0042B. The top lead frame 0042 is attached on the bottom lead frame 0041 by a thermally conductive, but electrically isolative, material, and subsequently, the top lead frame 0042 is molded together with the bottom lead frame 0041.

In one embodiment, the top lead frame 0042 further comprises top tie bars 0042C.

In a further embodiment, the bottom lead frame 0041 may comprise bottom tie bars.

The LED die 002 is conductively attached to the top lead frame 0042, creating electrical connection for the cathode 0042A. It is preferable, but not limited to, that in this embodiment, the LED die 002 is soldered to the top lead frame 0042.

A protection and driver circuit 005 is integrated to the top lead frame 0042 creating protection for the LED die 002. The LED die 002 and the protection circuit 005 are wire bonded to the anode 0042B of the top lead frame 0042, creating electrical connection for the anode 0042B. The clear lens 003 is then compression molded to cover the LED die 002 and the protection and driver circuit 005, creating optical path for the LED die 002 and the protection and driver circuit 005.

As the top lead frame 0042 is thermally connected to the bottom lead frame 0041, the heat from the LED die 002 attached to the top lead frame 0042 is dissipated to the heat sink of the bottom lead frame 0041. As such, the dual lead frame assembly 004 provides a good heat and power dissipation for the LED die 002, expanding the lifespan of the LED die 002.

FIG. 1A to FIG. 1G illustrate a flow diagram of manufacturing process of the SHDMIP LED package 002 in accordance with one embodiment of the present invention.

Figure 1A:
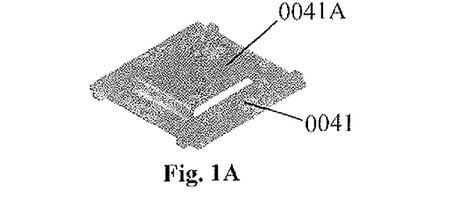
FIGS. 1A to 1G illustrate a flow diagram of manufacturing process of the SHDMIPE LED package of FIG. 1 in accordance with one embodiment of the present invention.

In FIG. 1A, a bottom lead frame 0041 having a heat sink 0041A is provided.

Figure 1B:
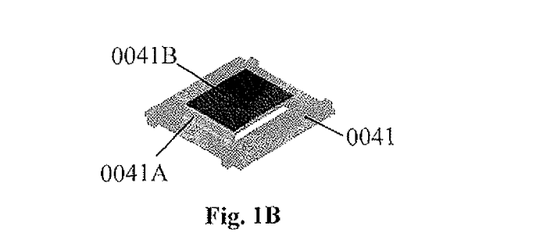

In FIG. 18, a thermally conductive, but electrically isolative, adhesion material 0041B is disposed over the heat sink 0041A of the bottom lead frame 0041.

Figure 1C:
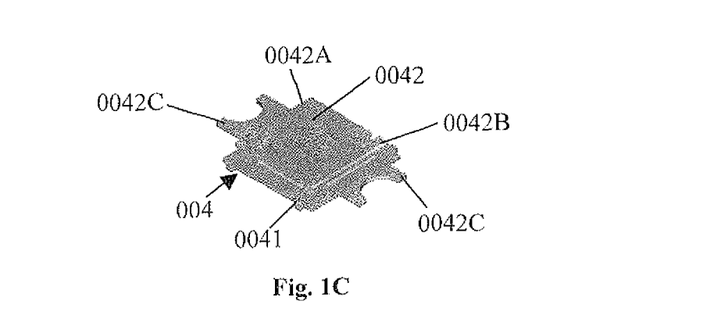

In FIG. 1C, a top lead frame 0042 is attached onto the bottom lead frame 0041, forming a dual lead frame assembly 004. The top lead frame 0042 comprises an anode 0042B and a cathode 0042A for external connection. Due to the thermally conductive, but electrically isolative, adhesion material 0041B, the top lead frame 0042 is thermally connected, but electrically isolated from, the bottom lead frame 0041.

Figure 1D:
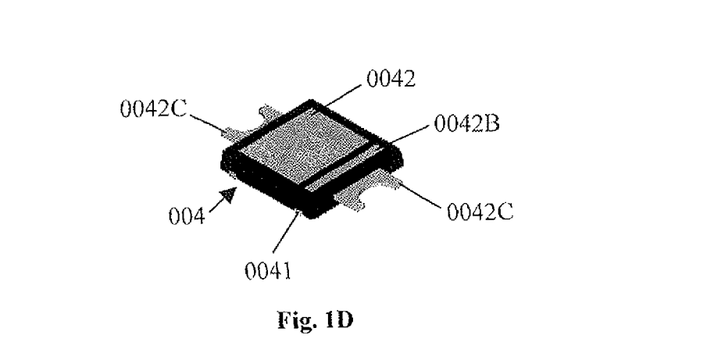

In FIG. 1D, the dual lead frame assembly 004 is molded.

Figure 1E:
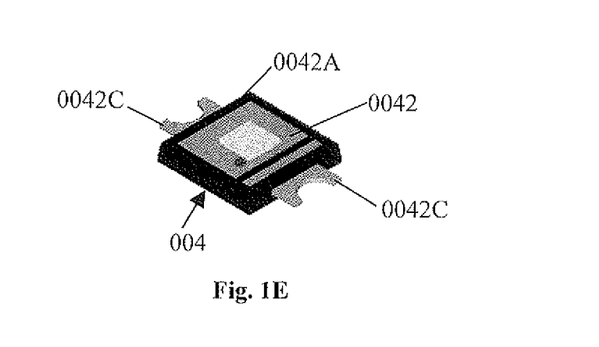

In FIG. 1E, a LED die 002 and a protection and driver circuit 005 are electrically attached to the top lead frame 0042 of the dual lead frame assembly 004. This forms an electrical connection with the cathode 0042A of the top lead frame 0042 of the dual lead frame assembly 004. In one embodiment, solder is used to attach the LED die 002 and the protection and driver circuit 005 to the top lead frame 0042.

Figure 1F:
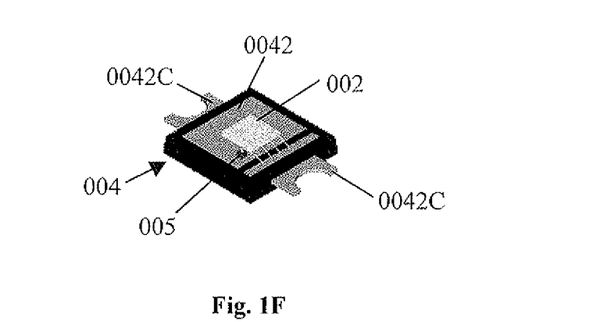

In FIG. 1F, the LED die 002 and the protection and driver circuit 005 are wire bonded to the anode 0042B of the top lead frame 0042. This establishes an electrical connection between the LED die 002 and the anode 0042B as well as between the protection and driver circuit 005 and the anode 0042B.

Figure 1G:
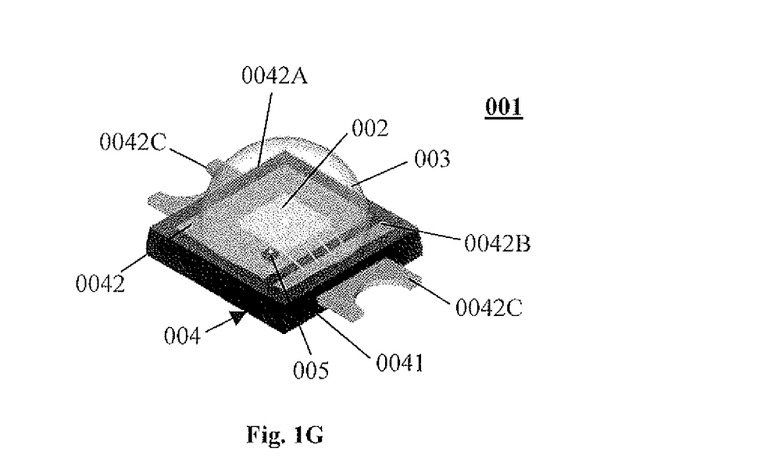

In FIG. 1G, a clear lens 003 is compression molded onto the top lead frame 0042 to protect and create an optical path for the LED die 002. The SHDMIP LED package 001 is thus provided.

Figure 2:
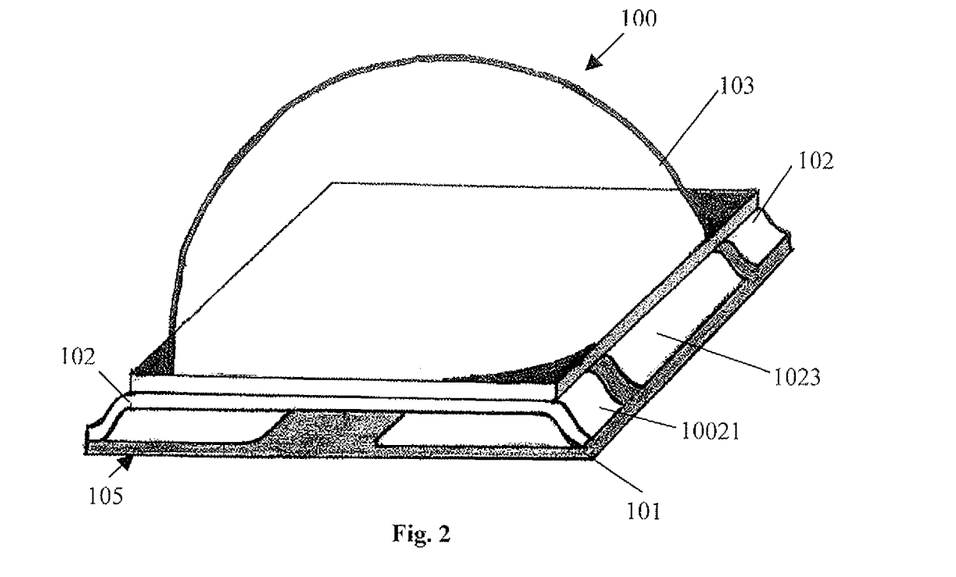
FIG. 2 shows a perspective view of a single SHDMIP LED package according to one embodiment of the present invention.

A perspective view of a single SHDMIP LED 100 package according to another embodiment of the present invention is shown in FIG. 2. Referring to FIG. 2 the SHDMIP LED package 100 of this embodiment comprises a commercially available LED die 103 and a dual lead frame assembly 105. The lead frame assembly 105 comprises bottom lead frame 101 having a first heat sink pad and top lead frame 102, which is thermally and electrically attached to the bottom lead frame 101. The top lead frame 102 comprises a second heat sink pad 1023, and external connection electrodes comprising an anode 1021 and a cathode 1022.

In another embodiment, the bottom lead frame also may comprise external connection electrodes comprising an anode and a cathode.

The LED die 103 is disposed over the top lead frame 102 of the lead frame assembly 105 and is thermally and electrically attached thereto, forming the SHDMIP LED package 100. The anode 1021 and the cathode 1022 electrically connect the dual lead frame assembly 105 to the LED 103 as well as provide external electrical connection for the lead frame assembly 105 and the LED 103.

It is preferable that a thermally and electrically conductive material, such as solder or glue, is dispensed onto the top lead frame 102 to thermally and electrically connect the LED die 103 to the top lead frame 102 of the lead frame assembly 105. In another embodiment, electrical connection between the LED die 103 and the top lead frame 102 can also be achieved via wire bonding. The thermal and electrical connection between the LED 103 and the lead frame assembly 105 promotes heat conduction therebetween.

Figure 2A:
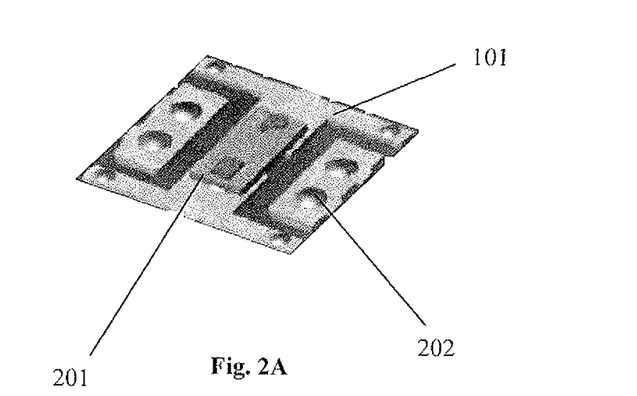
FIG. 2A is a plan view showing bottom lead frame of the SHDMIP LED package with protection circuit mounted thereon.

It is also desired that the SHDMIP LED package 100 of the present invention includes a protection circuit. The protection circuit further protects the LED 103, thus improves the protection and the reliability of the SHDMIP LED package 100. In one embodiment, the protection circuit is disposed under the top lead frame 102 and electrically connected thereto. In another embodiment, the protection circuit is disposed over the bottom lead frame 101 of the lead frame assembly 105. A plan view showing the bottom lead frame 101 with protection circuit 201 mounted thereon is illustrated in FIG. 2A. The protection circuit 201 is attached onto the bottom lead frame by means of thermally and electrically conductive material, such as solder or glue 202, or wire bonding, such that the protection circuit 201 is electrically connected to the bottom lead frame 101, whereby heat conduction between the protection device circuitry 201 and the bottom lead frame 101 is allowed.

The SHDMIP LED package 100 also comprises a driver circuit integrated to the bottom lead frame of the lead frame assembly by means of thermally conductive materials, such as solder or glue, or wire bonding. The driver circuit controls all components within the SHDMIP LED package 100.

In another embodiment, the driver circuit can also be attached on the top lead frame of the lead frame assembly.

The SHDMIP LED package of the present invention provides good heat dissipation as well as protection to the LED die. The top and bottom lead frames of the lead frame assembly is equipped with heat sink pads for excellent heat dissipation. The LED die is thermally connected to the second heat sink pad of the top lead frame so that the heat generated from the LED die is conducted to the second heat sink pad. In the meantime, the top lead frame, including the second heat sink pad, is conductively connected to the bottom lead frame having the first heat sink pad. With this manner, the heat generated from the LED die can be further conducted to the bottom lead frame, providing excellent heat dissipation to the LED die, thus extending lifespan of the LED die.

The lead frame assembly further provides electrical connections between the LED die and the protection circuit mounted on the bottom lead frame of the lead frame assembly, thus providing protection to the LED die. The electrical connection between the LED die and the protection circuit is described as follows: as the LED die is electrically connected to the top lead frame, the LED die indeed is electrically connected to the bottom lead frame, and therefore to the protection device circuitry. Accordingly, the LED die is electrically protected by the protection circuit.

Figure 3A:
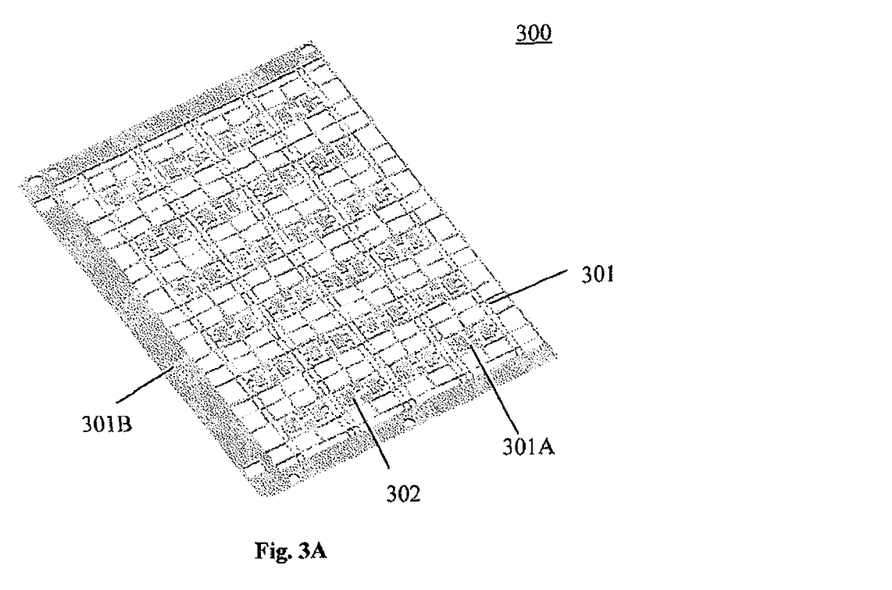
FIG. 3A shows an exemplary design of a matrix of a plurality of bottom lead frames in accordance with one embodiment of the present invention.

It is typically preferable that some single SHDMIP LED packages 100 are arranged in a row or matrix so as to realize a SHDMIP LED array for various lighting solutions. FIG. 3A shows an exemplary design of a matrix of a plurality of bottom lead frames 300 in accordance with one embodiment of the present invention. In this embodiment, the plurality of bottom lead frames 300 are made from copper. The matrix of the plurality of bottom lead frames 300 comprise a plurality of bottom lead frames 302 interconnected by plurality of bottom tie bars 301. The plurality of bottom tie bars 301 comprise plurality of internal bottom tie bars 301A and plurality of edge bottom tie bars 301B.

Figure 3B:
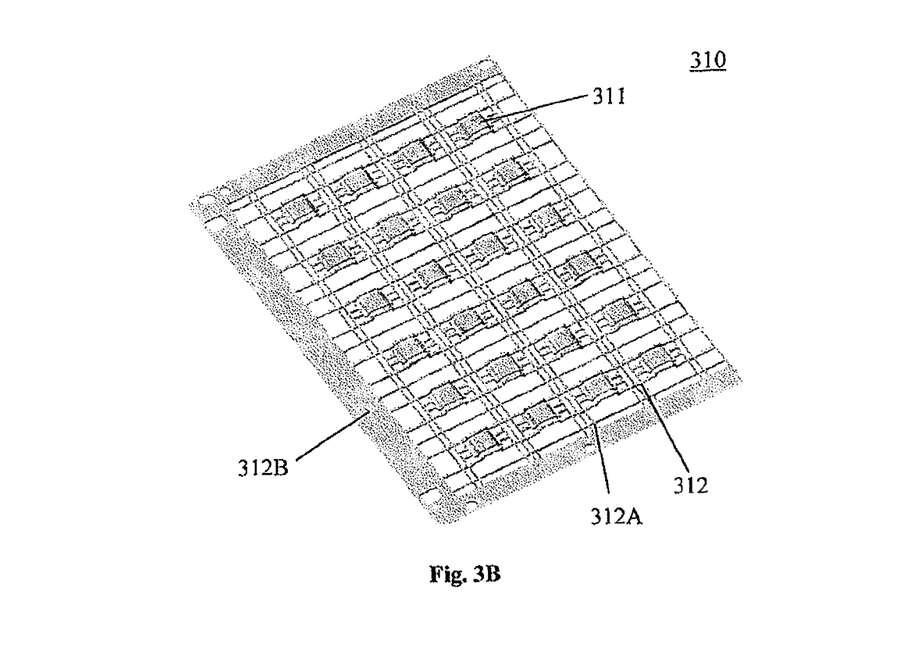
FIG. 3B shows an exemplary design of a matrix of a plurality top lead frames in accordance with one embodiment of the present invention.

FIG. 3B shows an exemplary design of a matrix of a plurality top lead frames 310 in accordance with one embodiment of the present invention. In this embodiment, the matrix of the plurality top lead frames 310 is made from copper. The matrix of the plurality of top lead frames 310 comprises a plurality of top lead frames 311 interconnected by a plurality of top tie bars 312. The plurality of top tie bars 312 comprise a plurality of internal top tie bars 312A and a plurality of edge top tie bars 312B.

The plurality of bottom tie bars and the plurality of top tie bars electrically interconnect the plurality of LED dies. The tie bars are trimmed accordingly to put the plurality of LED dies in a series, parallel, anti-parallel or some combinations thereof, electrical connection.

It is preferable that dimension of the matrix of the plurality of bottom lead frames and the matrix of the plurality of top lead frames are equal so that they can fit perfectly as they are attached together to form a matrix of a plurality of lead frame assemblies.

It is to be understood that the selection of copper for the top lead frames and the bottom lead frames in this embodiment is merely an example, not a limitation. The top lead frames and the bottom lead frames can be made from any metals, alloys, ceramics or any other suitable materials, such as ceramics.

Figure 4A:
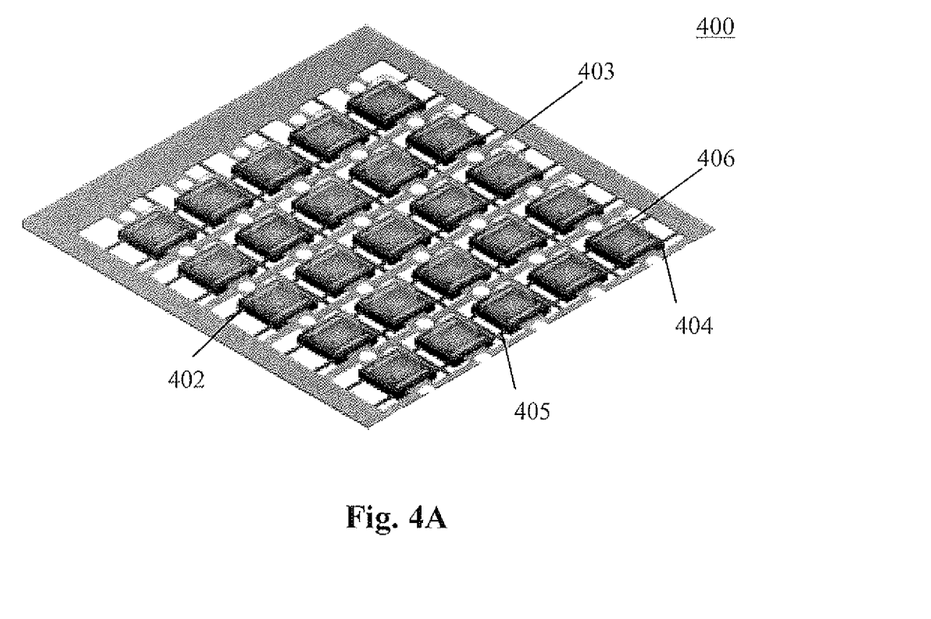
FIG. 4A illustrates a perspective view of an exemplary SHDMIP LED array according to one embodiment of the present invention.

FIG. 4A illustrates a perspective view of SHDMIP LED array 400 according to one embodiment of the present invention. The SHDMIP LED array 400 comprises the matrix of the plurality of bottom lead frames 402, wherein each of the plurality of bottom lead frames 402 interconnected by the plurality of bottom tie bars 403, a plurality of protection device circuits electrically attached onto each of the plurality of top lead frames 404, each of the plurality of top lead frames 404 interconnected by the plurality of top tie bars 405, and a plurality of LED die 406 electrically wire-bonded to the matrix of the plurality of top lead frames 404. Each of the plurality of top lead frames 404 is thermally connected to each of the plurality of bottom lead frames 402, providing heat dissipation to the plurality of LED 406.

Figure 4B:
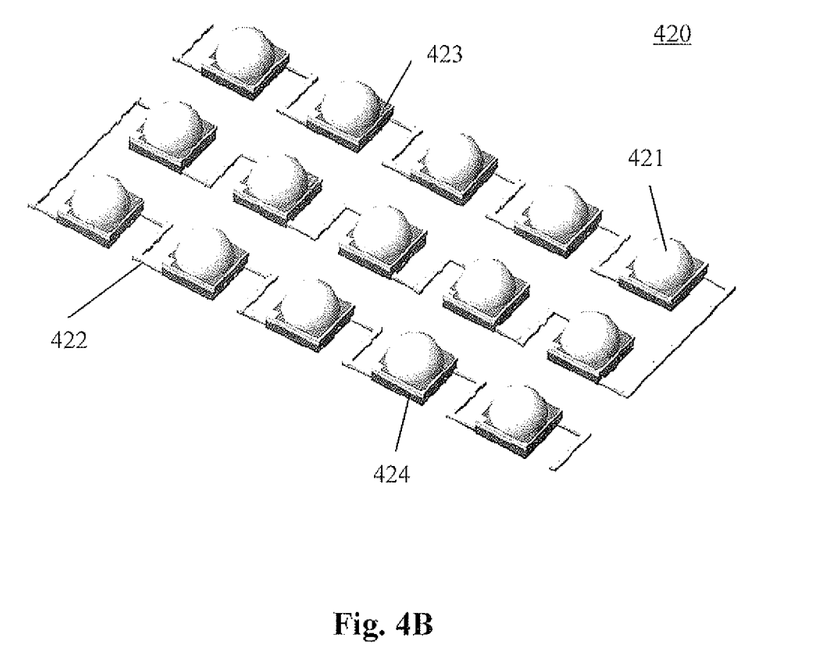
FIG. 4B illustrates a perspective view of another exemplary SHDMIP LED array according to another embodiment of the present invention.

FIG. 4B illustrates a perspective view of SHDMIP LED array 420 according to another embodiment of the present invention. In this embodiment, a plurality of commercially available LED 421 is attached to a matrix of plurality of dual lead frame assembly 422, comprising a matrix of plurality of top lead frame 423 thermally attached to a matrix of plurality of bottom lead frame 424. The SHDMIP LED array further comprises a plurality of protection and driver circuitries electrically attached to the matrix of the plurality of bottom lead frame 424.

In a further embodiment, the matrix of plurality of top lead frame is both thermally and electrically attached to the matrix of plurality of top lead frame.

In another further embodiment, the plurality of protection and driver circuitries can be integrated to the matrix of plurality of top lead frames.

The present invention also provides a method to manufacture SHDMIP LED array. In general, the method comprises the steps of providing a matrix of a plurality of bottom lead frames interconnected by a plurality of bottom tie bars and a matrix of a plurality of top lead frames interconnected by a plurality of top tie bars, electrically integrating a plurality of driver circuits to the matrix of the plurality of bottom lead frames or to the matrix of the plurality of top lead frames, electrically connecting a plurality of protection device circuitries to the matrix of the plurality of bottom lead frames or to the matrix of the plurality of top lead frames, electrically connecting the matrix of the plurality of bottom lead frames and the matrix of the plurality of top lead frames to form a matrix of plurality of lead frame assembly, and electrically connecting a plurality of LED dies to the matrix of plurality of lead frame assembly.

FIGS. 5A to 5F illustrate a flow diagram of manufacturing process of the SHDMIP LED array 500 in accordance with one embodiment of the present invention.

Figure 5A:
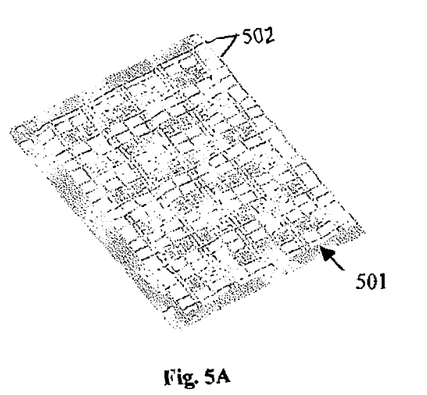
FIG. 5A to 5F illustrate a flow diagram of manufacturing process of a SHDMIP LED array in accordance with one embodiment of the present invention.

In FIG. 5A, a matrix of a plurality of bottom lead frames 501 interconnected by a plurality of bottom tie bars 502 is provided. Subsequently, over the matrix of the plurality of bottom lead frames 501, a thermally conductive material, such as solder or glue, is dispensed.

Figure 5B:
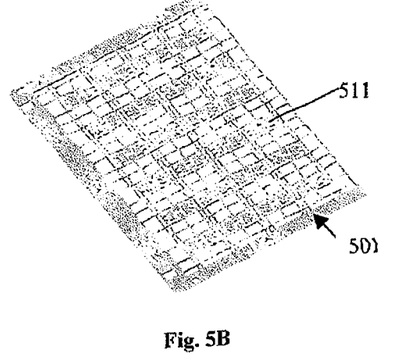

In FIG. 5B, a plurality of protection circuits 511 is respectively connected onto each of the matrix of the plurality of bottom lead frames 501 by means of solder or any thermally conductive material. In another embodiment, the plurality of protection circuitry devices 511 can be attached onto each of the matrix of the plurality of bottom lead frames 501 by means of wire bonding.

In a further embodiment, a plurality of driver circuits is singly attached electrically onto each of the matrix of the plurality of bottom lead frames 501.

Figure 5C:
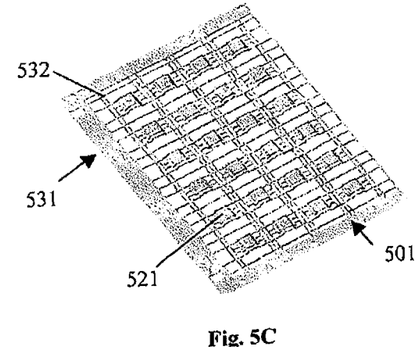

In FIG. 5C, a matrix of a plurality of top lead frames 521, interconnected by a plurality of top tie bars 522, is attached onto the matrix of the plurality of bottom lead frames 501, covering the plurality of protection device circuitries 511 thereon. The attachment of the top lead frames 521 to the bottom lead frame 501 forms a matrix of a plurality of lead frame assemblies 531.

Figure 5D:
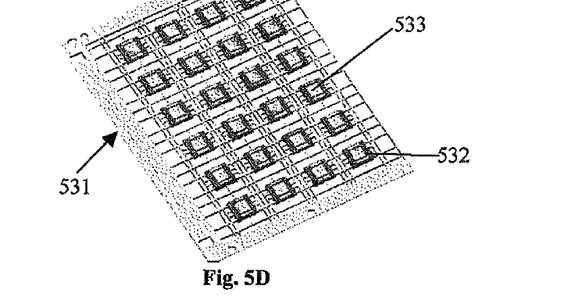

In FIG. 5D, the matrix of the plurality of lead frame assemblies 531 undergoes cavity molding process 532, and subsequently thermal conductive materials 533, such as solder, is dispensed over the matrix of the plurality of lead frame assemblies 531. The cavity molding provides an individualized package molding for each of plurality of LED dies as the plurality of tie bars are not molded.

Figure 5E:
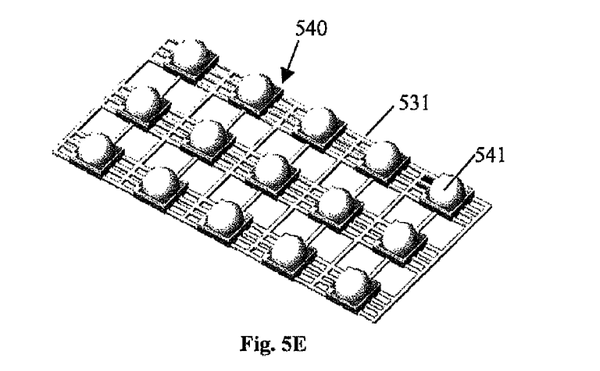

After the solder is dispensed, in FIG. 5E, a plurality of LED dies 541 are singly attached over the matrix of the plurality of lead frame assemblies 531, forming a SHDMIP LED array according to one embodiment of the present invention 540.

Figure 5F:
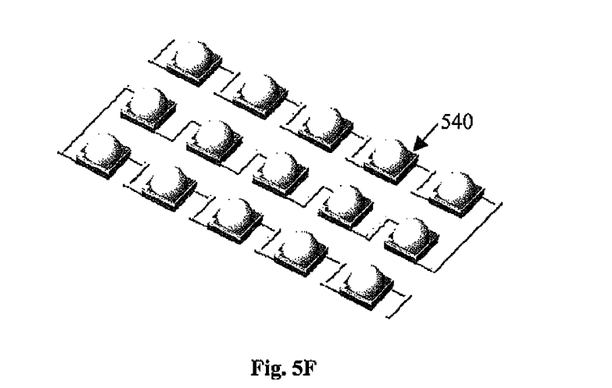

In FIG. 5F, some of the plurality of bottom tie bars 502 and the plurality of top tie bars 522 are trimmed to configure electrical connection of the SHDMIP LED array 540 for any lighting solutions. The electrical connection of the SHDMIP LED array can be configured in series, in parallel, in anti-parallel or in some combinations thereof.

As previously described, in another different embodiment, the plurality of protection device circuitries can be attached to the plurality of top lead frames. Similarly, the plurality of driver circuits can be attached to the plurality of top lead frames.

Figure 6:
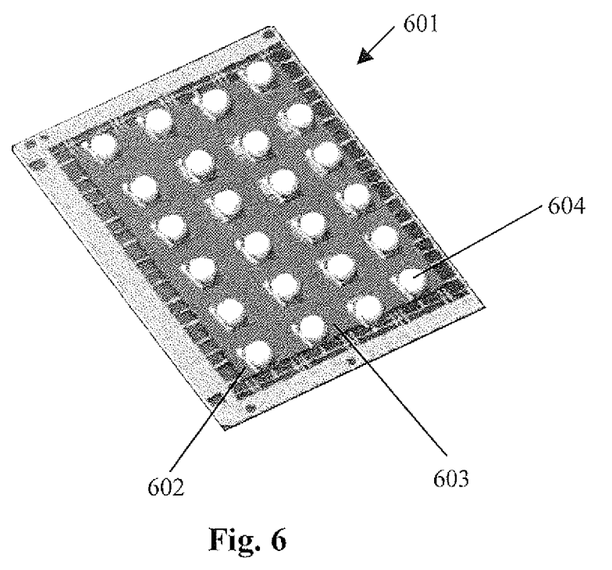
FIG. 6 shows a perspective view of an exemplary SHDMIP LED array in accordance with another embodiment of the present invention.

FIG. 6 shows an exemplary SHDMIP LED array 601 in accordance with another embodiment of the present invention. In the present embodiment, once a matrix of plurality of lead frame assemblies 602 is formed, the matrix of the plurality of lead frame assemblies 602 is not subjected to cavity molding, but top and bottom tie bars of the matrix of the plurality of lead frame assemblies 602 are immediately trimmed to configure electrical connection of the SHDMIP LED array 601. Subsequently, the trimmed matrix of the plurality of lead frame assemblies 602 is subjected to panel molding 603, and a plurality of LED dies 604 are then attached thereto. The panel molding 603 will encapsulate all interconnections by the plurality of tie bars. This configuration provides a flat LED package which can include holes for accommodating screws or nuts/bolts so that the LED package can be mounted to flat surfaces.

Figure 7:
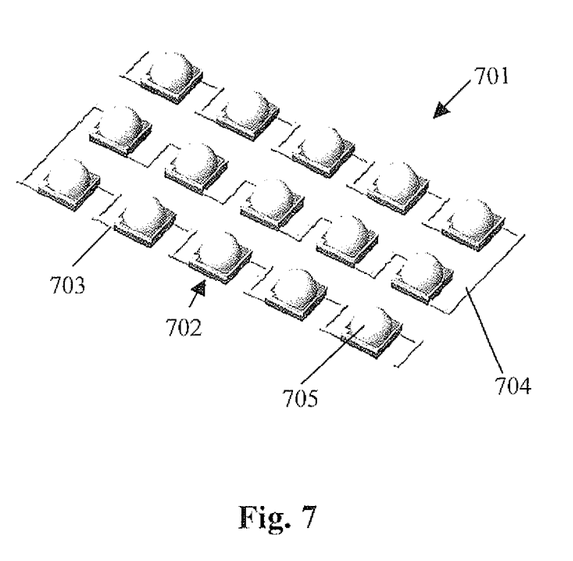
FIG. 7 shows a perspective view of an exemplary SHDMIP LED array in accordance with another embodiment of the present invention

FIG. 7 shows an exemplary SHDMIP LED array 701 in accordance with another embodiment of the present invention. In the present embodiment, a matrix of plurality of lead frame assemblies 702 of the SHDMIP LED array 701 is not subjected to any molding at all. After the matrix of the plurality of lead frame assemblies 702 is formed, some of a plurality of bottom tie bars 703 and a plurality top tie bars 704 of the matrix of the plurality of lead frame assemblies 702 are immediately trimmed to configure electrical connection of the SHDMIP LED array 701. Plurality of LED dies 705 is then directly disposed over the bare matrix of the plurality of lead frame assemblies 702.

The present invention provides a SHDMIP LED package with an extended lifespan compared to the prior art. The SHDMIP LED package of the present invention has excellent heat dissipation. Additionally, the SHDMIP LED package of the present invention also gives a better protection to the LED, thus guarantees the lifetime and function of the LED.

In addition, method to manufacture the SHDMIP LED package of the present invention is a standardized method that provides high rate of integration of between the LED dies and other circuitry devices. A single SHDMIP LED package of the present invention can accommodate plurality of circuitry devices, such as inverter, current/voltage protection device and a LED die, yet size of the SHDMIP LED package can be as small as 5 mm by 6 mm.

Various lighting solutions can be realized by configuring plurality of SHDMIP LED package of the present invention in a row or matrix of lead frames interconnected by plurality of tie bars. The plurality of LED dies can be electrically connected in series, parallel, anti-parallel or some combinations thereof. To configure the electrical connection of the plurality of SHDMIP LED array, some of the tie bars present in lead frame of the SHDMIP LED array need to be trimmed accordingly. The lead frame assembly can accommodate and interconnect more than hundred LEDs, thereby it is cost effective to use such high density lead frame assembly. With the high-density lead frame, the SHDMIP LED package is economical to be manufactured; yet it is effective and reliable.

The above description illustrates various embodiments of the present invention along with examples of how aspects of the present invention may be implemented. While specific embodiments have been described and illustrated it is understood that many changes, modifications, variations and combinations thereof could be made to the present invention without departing from the scope of the present invention. The above examples, embodiments, instructions semantics, and drawings should not be deemed to be the only embodiments, and are presented to illustrate the flexibility and advantages of the present invention as defined by the following claims:

The invention claimed is:

1. A Scalable Heat Dissipating Microelectronic Integration Platform (SHDMIP) array for lighting solutions comprising:
   a matrix of dual lead frame assembly comprising:
      a matrix of a plurality of bottom lead frames, wherein each of bottom lead frames has a first heat sink pad and is interconnected by a plurality of bottom tie bars; and
      a matrix of a plurality of top lead frames, wherein each of top lead frames has a second heat sink pad and is interconnected by a plurality of top tie bars, and wherein the matrix of plurality of top lead frames is thermally connected to the matrix of plurality of bottom lead frames;
      wherein at least the matrix of the plurality of top lead frames comprises an anode and a cathode for external connection purpose;
   a plurality of protection and driver circuits, wherein each of the plurality of protection and driver circuits is electrically attached onto each of the plurality of top lead frames of the matrix of dual lead frame assembly; and
   a plurality of microelectronic lighting devices electrically attached to the matrix of the plurality of top lead frames and to each of the plurality of protection and driver circuits;
   wherein adjacent microelectronic lighting devices and associated protection and driver circuits are connected in series, parallel or combination of series and parallel by the top tie bars.

2. The SHDMIP array of claim 1, wherein the microelectronic lighting device is selected from the group consisting of commercially available light emitting diodes (LEDs), organic light emitting diodes, and infrared light emitting diodes.

3. The SHDMIP array of claim 1, wherein the matrix of dual lead frame assembly is made from materials selected from the group consisting of metals, alloys and ceramics.

4. The SHDMIP array of claim 3, wherein the matrix of dual lead frame assembly is made from copper.

5. The SHDMIP array of claim 1, wherein the microelectronic lighting device is electrically and thermally connected to each of the plurality of top lead frames by means of thermally and electrically conductive material selected form the group consisting of solders and adhesive materials.

6. The SHDMIP array of claim 1, wherein the plurality of protection and device circuits are connected to the plurality of top lead frames by means of thermally and electrically conductive material selected from the group consisting of solders and adhesive materials.

7. A scalable Heat Dissipating Microelectronic Integration Platform (SHDMIP) array for lighting solutions comprising:
   a matrix of dual lead frame assembly comprising:
      a matrix of a plurality of bottom lead frames, wherein each of bottom lead frames has a first heat sink pad and is interconnected by a plurality of bottom tie bars; and
      a matrix of a plurality of top lead frames, wherein each of top lead frames has a second heat sink pad and is interconnected by a plurality of top tie bars, and wherein the matrix of plurality of top lead frames is conductively connected to the matrix of plurality of bottom lead frames;
      wherein at least the matrix of the plurality of top lead frames comprises an anode and a cathode for external connection purpose;
   a plurality of protection and driver circuits, wherein each of the plurality of protection and driver circuits is electrically connected to each of the plurality of bottom lead frames of the matrix of dual lead frame assembly; and
   a plurality of microelectronic lighting devices electrically attached to the matrix of the plurality of top lead frames and to each of the plurality of protection and driver circuits;
   wherein adjacent microelectronic lighting devices and associated protection and driver circuits are connected in series, parallel or series and parallel by the top and bottom tie bars.

8. The SHDMIP array of claim 7, wherein the microelectronic lighting device is selected from the group consisting of commercially available light emitting diodes (LEDs), organic light emitting diodes, and infrared light emitting diodes.

9. The SHDMIP array of claim 7, wherein the matrix of dual lead frame assembly is made from materials selected from the group consisting of metals, alloys and ceramics.

10. The SHDMIP array of claim 9, wherein the matrix of dual lead frame assembly is made from copper.

11. The SHDMIP array of claim 7, wherein the microelectronic lighting device is electrically and thermally connected to each of the plurality of top lead frames by means of thermally and electrically conductive material selected form the group consisting of solders and adhesive materials.

12. The SHDMIP array of claim 7, wherein the plurality of protection and device circuits are connected to the plurality of bottom lead frames by means of thermally and electrically conductive material selected from the group consisting of solders and adhesive materials.

13. A method to manufacture a Scalable Heat Dissipating Microelectronic Integration Platform (SHDMIP) array for lighting solutions comprising the steps of:
providing a matrix of a plurality of bottom lead frames having a plurality of heat sink, the plurality of bottom lead frames are interconnected by a plurality of bottom tie bars;
thermally and electrically attaching a plurality of protection/driver circuit onto the matrix of the plurality of bottom lead frames;
thermally connecting a matrix of a plurality of top lead frames interconnected by a plurality of top tie bars onto the matrix of the plurality of bottom lead frames to form a matrix of a plurality of dual lead frame assembly, wherein each of the plurality of top lead frames comprises an anode and a cathode for external connection purpose; and
thermally and electrically connecting a plurality of microelectronic lighting devices to the matrix of the plurality of top lead frames;
wherein adjacent microelectronic lighting devices and associated protection/driver circuits are connected in series, parallel or combination of series and parallel by the top tie bars.

14. The method of claim 13, wherein the plurality of microelectronic lighting device are selected from the group consisting of light emitting diodes (LEDs), organic light emitting diodes, and infrared light emitting diodes.

15. The method of claim 13, wherein the step of attaching a plurality of microelectronic lighting devices onto the matrix of the plurality of top lead frames comprises dispensing thermally conductive materials selected from the group consisting of solders, glue and thermally adhesive materials, over the matrix of the plurality of top lead frames or wire bonding the plurality of microelectronic lighting devices to the matrix of the plurality of top lead frames.

16. The method of claim 13, wherein the step of attaching a plurality of protection and driver circuits to the matrix of bottom lead frames comprises dispensing thermally conductive materials selected from the group consisting of solders, glue and thermally adhesive materials, over the matrix of bottom lead frames or wire bonding the plurality of protection and driver circuits to the matrix of plurality of bottom lead frames.

17. The method of claim 13, further comprising the steps of:
molding the matrix of the plurality of the dual lead frame assembly; and
trimming some of the plurality of bottom and top tie bars.

18. The method of claim 13, wherein the matrix of lead frame assembly is made from materials selected from the group consisting of metals, alloys and ceramics.

19. The method of claim 18, wherein the matrix of lead frame assembly is made from copper.

20. A method to manufacture a Scalable Heat Dissipating Microelectronic Integration Platform (SHDMIP) array for lighting solutions comprising the steps of:
providing a matrix of a plurality of bottom lead frames having a plurality of heat sink, the plurality of bottom lead frames are interconnected by a plurality of bottom tie bars;
thermally and electrically connecting a matrix of a plurality of top lead frames interconnected by a plurality of top tie bars onto the matrix of the plurality of bottom lead frames to form a matrix of a plurality of dual lead frame assembly, wherein each of the plurality of top lead frames comprises an anode and a cathode for external connection purpose;
thermally and electrically attaching a plurality of protection circuitry devices onto the matrix of the plurality of top lead frames; and
thermally and electrically connecting a plurality of microelectronic lighting devices to the matrix of the plurality of top lead frames;
wherein adjacent microelectronic lighting devices and associated protection/driver circuits are connected in series, parallel or series and parallel by the top and bottom tie bars.

21. The method of claim 20, wherein the plurality of microelectronic lighting device are selected from the group consisting of light emitting diodes (LEDs), organic light emitting diodes, and infrared light emitting diodes.

22. The method of claim 20, wherein the step of connecting a plurality of microelectronic lighting devices onto the matrix of the plurality of top lead frames comprises dispensing thermally conductive materials selected from the group consisting of solders, glue and thermally adhesive materials, over the matrix of the plurality of top lead frames or wire bonding the plurality of microelectronic lighting devices to the matrix of the plurality of top lead frames.

23. The method of claim 20, wherein the step of attaching a plurality of protection and driver circuits to the matrix of bottom lead frames comprises dispensing thermally conductive materials selected from the group consisting of solders, glue and thermally adhesive materials, over the matrix of bottom lead frames or wire bonding the plurality of protection and driver circuits to the matrix of plurality of bottom lead frames.

24. The method of claim 20, further comprising the steps of:
molding the matrix of the plurality of the dual lead frame assembly; and
trimming some of the plurality of bottom and top tie bars.

25. The method of claim 20, wherein the matrix of lead frame assembly is made from materials selected from the group consisting of metals, alloys and ceramics.

26. The method of claim 25, wherein the matrix of lead frame assembly is made from copper.

27. A method to manufacture a Scalable Heat Dissipating Microelectronic Integration Platform (SHDMIP) array for lighting solutions comprising the steps of:
providing a matrix of a plurality of bottom lead frames having a plurality of heat sinks, each of the plurality of bottom lead frames is interconnected by a plurality of bottom tie bars;
providing a matrix of a plurality of top lead frames having an anode and a cathode for external connection purpose, wherein each of the plurality of top lead frames is interconnected by a plurality of top tie bars;
thermally connecting the matrix of the plurality of top lead frames, to the matrix of the plurality of bottom lead frames, forming a matrix of a plurality of dual lead frame assembly;

electrically attaching a plurality of protection and driver circuits to the cathode of the top lead frames of the matrix of the plurality of dual lead frame assembly;

electrically attaching a plurality of LED dies to the cathode of the top lead frames of the matrix of the plurality of dual lead frame assembly;

wirebonding each of the plurality of LED dies and the plurality of protection and driver circuits to the anode of the matrix of the plurality of top lead frames; and encapsulating the LED die and the plurality of protection and driver circuits with a clear lens for protecting and creating optical path for the plurality of LED dies;

wherein adjacent LED dies and associated protection and driver circuits are connected in series, parallel or combination of series and parallel by the associated top tie bars.

28. The method of claim 27, further comprising the step of molding the matrix of the plurality of dual lead frame assembly after the matrix of the plurality of dual lead frame assembly is formed.

29. The method of claim 28, further comprising the step of trimming some of the plurality of bottom and top tie bars.

\* \* \* \* \*